(12) United States Patent
Kyllonen et al.

(10) Patent No.: US 10,381,325 B1
(45) Date of Patent: Aug. 13, 2019

(54) GUIDE POSTS FOR WIRE BONDING

(71) Applicant: AUTOMATED ASSEMBLY CORPORATION, Lakeville, MN (US)

(72) Inventors: Kimmo Kyllonen, Shakopee, MN (US); Robert Neuman, Cannon Falls, MN (US)

(73) Assignee: Automated Assembly Corporation, Lakeville, MN (US)

( * ) Notice: Subject to any disclaimer, the term of this patent is extended or adjusted under 35 U.S.C. 154(b) by 168 days.

(21) Appl. No.: 15/668,870

(22) Filed: Aug. 4, 2017

(51) Int. Cl.
*H01L 23/52* (2006.01)
*H01L 23/00* (2006.01)
*B23K 20/00* (2006.01)

(52) U.S. Cl.
CPC ............ *H01L 24/85* (2013.01); *B23K 20/007* (2013.01); *H01L 24/48* (2013.01); *H01L 24/78* (2013.01); *H01L 24/97* (2013.01); *H01L 2224/85205* (2013.01); *H01L 2924/01013* (2013.01); *H01L 2924/01029* (2013.01)

(58) Field of Classification Search
CPC ......... H01L 24/48; H01L 24/78; H01L 24/85; H01L 24/97
USPC .......................................................... 257/690
See application file for complete search history.

(56) References Cited

U.S. PATENT DOCUMENTS

| | | | |
|---|---|---|---|
| 5,471,010 A | 11/1995 | Bockelman et al. | |
| 6,262,513 B1 | 7/2001 | Furukawa et al. | |
| 6,822,340 B2 | 11/2004 | Lamson | |
| 7,154,046 B2 | 12/2006 | Chung | |
| 7,581,308 B2 * | 9/2009 | Finn ................. | G06K 19/07745 29/600 |
| 7,714,334 B2 | 5/2010 | Lin | |
| 7,745,253 B2 | 6/2010 | Luechinger | |
| 7,875,504 B2 | 1/2011 | Silverbrook et al. | |
| 7,979,975 B2 * | 7/2011 | Finn ................. | G06K 19/07327 235/492 |
| 7,989,949 B2 | 8/2011 | Gupta et al. | |
| 8,012,362 B2 | 9/2011 | Usui et al. | |
| 8,102,038 B2 | 1/2012 | Sahasrabudhe et al. | |
| 8,522,431 B2 | 9/2013 | Finn | |
| 8,558,752 B2 * | 10/2013 | Amadeo .......... | G06K 19/07779 343/742 |
| 8,860,162 B2 | 10/2014 | Linderman et al. | |

(Continued)

FOREIGN PATENT DOCUMENTS

JP            01151220 A      6/1989

OTHER PUBLICATIONS

Lindblad et al., "Wire Bonded IC Components to Round Wire", U.S. Appl. No. 14/553,519, filed Nov. 25, 2014.

*Primary Examiner* — Luan C Thai
(74) *Attorney, Agent, or Firm* — Crawford Maunu PLLC

(57) ABSTRACT

A disclosed circuit arrangement includes a support structure having first and second posts. Electrically conductive round wire has a round cross-section, and a first portion is wrapped at least partially around the first post. A second portion of the wire extends in a straight line from a point on a perimeter of the first post to a point on a perimeter of the second post, and a third portion of the wire is wrapped at least partially around the second post. The second portion of the round wire defines one or more bond sites. An electronic device is electrically connected to the round wire at one of the one or more bond sites.

13 Claims, 9 Drawing Sheets

(56) References Cited

U.S. PATENT DOCUMENTS

| | | | |
|---|---|---|---|
| 8,991,709 B2 * | 3/2015 | Mieslinger | G06K 19/07749 235/492 |
| 9,196,958 B2 | 11/2015 | Arnold et al. | |
| 9,431,363 B1 | 8/2016 | Lindblad et al. | |
| 9,565,752 B1 | 2/2017 | Neuman et al. | |
| 9,647,160 B2 | 5/2017 | Krajewski | |
| 2002/0053735 A1 | 5/2002 | Neuhaus et al. | |
| 2003/0122233 A1 | 7/2003 | Yagi et al. | |
| 2005/0128086 A1 | 6/2005 | Brown et al. | |
| 2005/0133928 A1 | 6/2005 | Howard et al. | |
| 2005/0205985 A1 | 9/2005 | Smith et al. | |
| 2005/0253286 A1 | 11/2005 | Yoshikawa et al. | |
| 2008/0278793 A1 | 11/2008 | Tonar et al. | |
| 2009/0261444 A1 | 10/2009 | Yamazaki et al. | |
| 2011/0064788 A1 | 3/2011 | Weimann | |
| 2011/0169641 A1 | 7/2011 | Lin | |
| 2011/0304327 A1 | 12/2011 | Ausserlechner | |
| 2012/0126418 A1 | 5/2012 | Feng et al. | |
| 2014/0036337 A1 | 2/2014 | Neuman et al. | |
| 2014/0239509 A1 | 8/2014 | Kim et al. | |
| 2015/0187729 A1 | 7/2015 | Chew | |
| 2015/0229017 A1 | 8/2015 | Suzuki et al. | |
| 2015/0344294 A1 | 12/2015 | Ghahremani et al. | |

\* cited by examiner

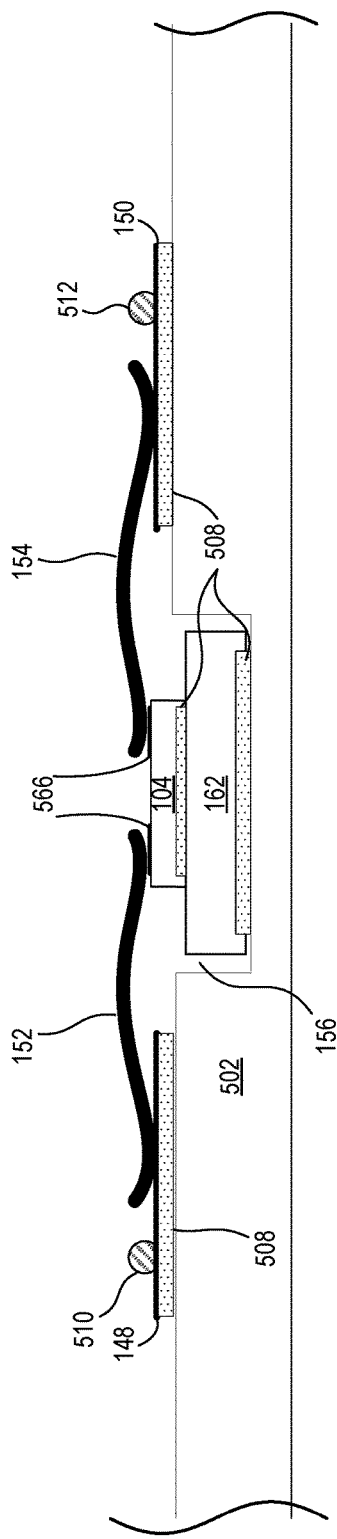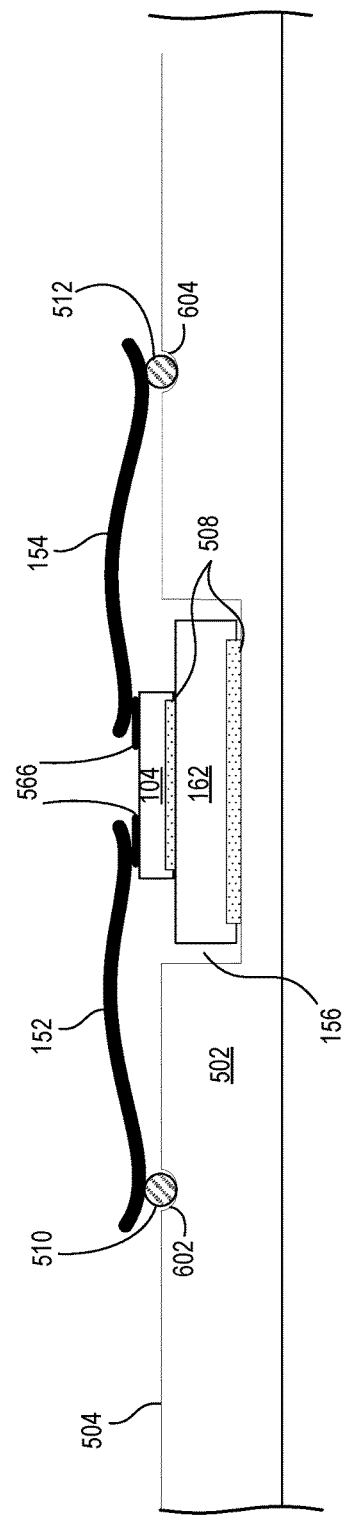

GUIDE POSTS FOR WIRE BONDING

FIELD OF THE INVENTION

The disclosure describes using guide posts for locating bond sites for wire bonding.

BACKGROUND

RF transponders are used in a variety of applications including identification, mobile payment, and environmental sensing and reporting. Makers of RF transponders face the ongoing challenge of making structures that are both functional and economically competitive. For many applications, RF transponders and associated wiring are attached to a flexible substrate. Prior to mounting the electronic device, wiring patterns may be formed on the substrate using a print-and-etch process to construct the antenna. Making RF transponder arrangements on a flexible substrate may be prohibitively expensive for some applications. The expense is attributable in part to the print-and-etch processes used in creating the wiring pattern. Expensive chemicals are required for print-and-etch processes, and hazardous waste is a byproduct.

SUMMARY

The above summary is not intended to describe each disclosed embodiment. The figures and detailed description that follow provide additional example embodiments.

A disclosed circuit arrangement includes a support structure having first and second posts. Electrically conductive round wire has a round cross-section, and a first portion is wrapped at least partially around the first post. A second portion of the wire extends in a straight line from a point on a perimeter of the first post to a point on a perimeter of the second post, and a third portion of the wire is wrapped at least partially around the second post. The second portion of the round wire defines one or more bond sites. An electronic device is electrically connected to the round wire at one of the one or more bond sites.

BRIEF DESCRIPTION OF THE DRAWINGS

Other aspects and advantages will become apparent upon review of the Detailed Description and upon reference to the drawings in which:

FIG. 11 shows a cross section of a portion of the structure of FIG. 10 taken in direction a;

FIG. 12 shows an alternative wire bond connection between an RF transponder and antenna wire using bond pads;

FIG. 13 shows a partial cross-sectional view of an alternative implementation in which portions of antenna wire are disposed in channels in the support structure.

DETAILED DESCRIPTION

Figure 1:
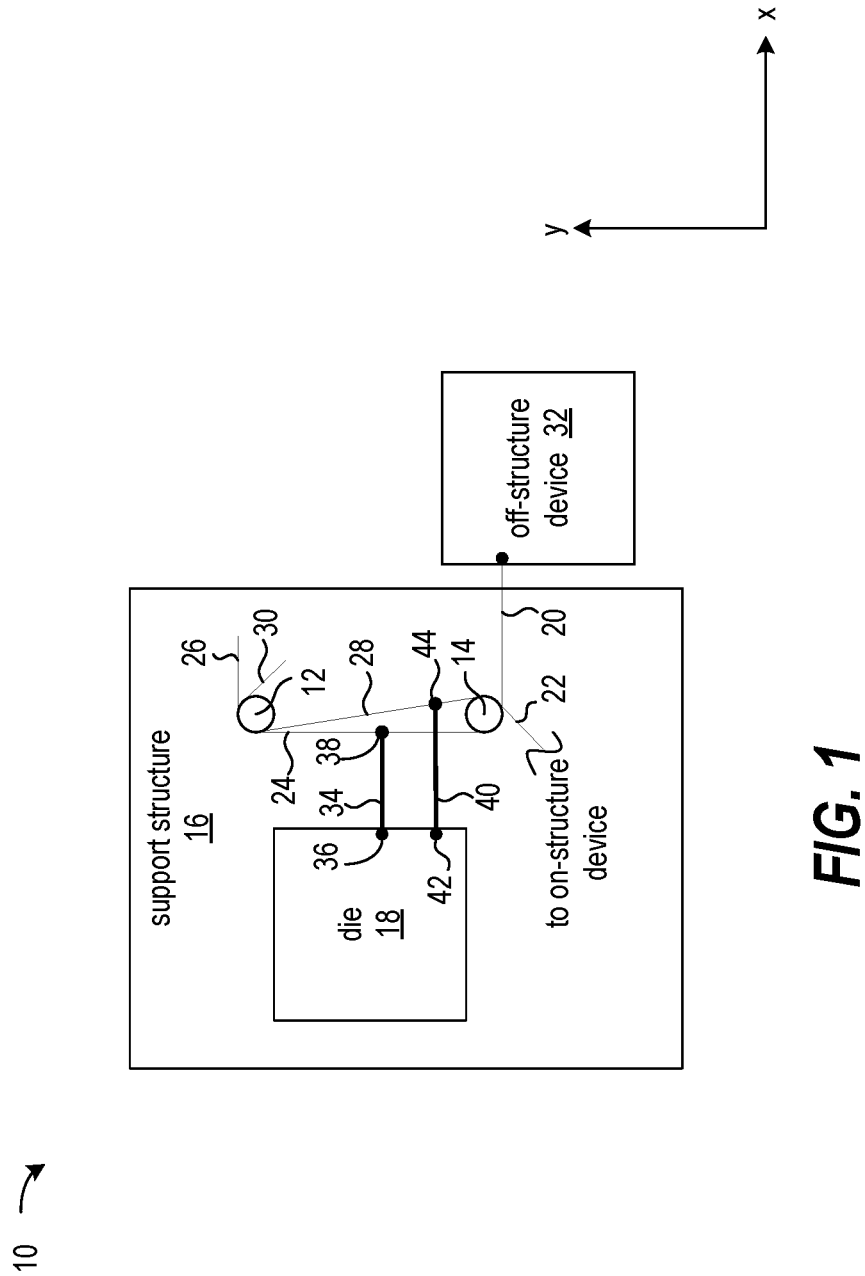
FIG. 1 shows an exemplary circuit arrangement 10 having posts 12 and 14 for guiding the path of circuit wiring

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Terms such as over, under, top, bottom, above, below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Some manufacturers use round wire rather than printed-and-etched patterns of conductive material for wiring the electronic devices. "Wire" as used herein does not refer to printed or printed-and-etched patterns of conductive material. Rather, as used herein, wire refers to one or more strands of conductive material that have been made, for example, by drawing the conductive material through draw plates. Using a fine gauge copper wire to make antennas eliminates the use of environmentally hazardous chemicals as would be required for printed-and-etched antennas. However, connecting the wire to an electronic device presents additional challenges. Electronic devices as used herein refers to integrated circuit (IC) dice as well as to discrete components such as batteries, capacitors, resistors, etc.

Automated wire bonding machines may be used to construct wire bonds between the antenna and/or power wiring and the electronic device. With fine gauge wire as the antenna/power wire, the wire bonding machine may have difficulty locating the desired portions of the wiring at which the wire bonding is to occur. Distinguishing a strand of the fine gauge wire from the adhesive that binds the antenna wire to the substrate may be problematic based on imagery gathered by the wire bonding machine. In addition, even if the wire bonding machine is properly positioned, making a wire bond on the fine gauge antenna wire may be problematic. The fine gauge and rounded surface of the wire are not conducive to making a strong joint between the wire and bond wire.

The disclosed approaches simplify locating bond sites on round wire and wire bonding to the round wire. In order to facilitate wire bonding an electronic device to round wire, a disclosed circuit arrangement includes a support structure having first and second posts. Electrically conductive round wire has a round cross-section, and a first portion is wrapped at least partially around the first post. A second portion of the wire extends in a straight line from a point on a perimeter of the first post to a point on a perimeter of the second post, and a third portion of the wire is wrapped at least partially around the second post. The second portion of the round wire defines one or more bond sites. An electronic device electrically is connected to the round wire at one of the one or more bond sites.

FIG. 1 shows an exemplary circuit arrangement 10 having posts 12 and 14 for guiding the path of circuit wiring. The circuit arrangement 10 includes a support structure 16 having at least one IC die 18 attached thereto. The support structure can be any shape and material suitable for application requirements. In an exemplary application the support structure is a polymer resin.

The support structure includes guide posts 12 and 14. The guide posts can be any shape suitable for holding the wiring in place and compatible with application requirements. The guide posts can be unitary portions of the support structure or attached to the support structure as separate members.

The electronic device(s) 18 and wiring 22 and 20 can be attached to one or more surfaces of the support structure using a pressure-sensitive adhesive, for example.

The wiring of the circuit arrangement is electrically conductive round wire. The wiring can be used for power and/or signaling and can be bare or insulated, depending on the application. The exemplary circuit arrangement 10 includes wiring for two different connections to the die 18 using the same two posts. For two different connections to the die 18, two physically separate wires can be used. Other implementations can include a single wire between the posts. For example, wire 20 connects an off-structure component to the die 18, and wire 22 connects an on-structure component to the die. "On-structure" describes the component as being mounted on the support structure 16, and "off-structure" describes to the component as not being mounted on the support structure.

Each of wires 20 and 22 is partially wrapped around both of the posts 12 and 14. Wire 20 is partially wrapped around post 14 and includes a portion 24 extending from a point in the perimeter of post 14 to a point on the perimeter of post 12. The wire 20 is also partially wrapped around post 12 and includes an end portion 26. Similarly, wire 22 is partially wrapped around post 14 and includes a portion 28 extending from a point in the perimeter of post 14 to a point on the perimeter of post 12. The wire 22 is also partially wrapped around post 12 and includes an end portion 30.

The portions 24 and 28 of the wiring between the posts form straight lines. The positions of the posts and the portions of wire extending between the posts provides easy identification of bond sites at which the die can be connected to the wiring. The locations and dimensions of the posts are fixed relative to the support structure. Thus, the precise location of the path of the wiring between two posts can be determined based on the directions the portions of the antenna wire are wrapped at least partially around the posts. As the path of the wiring is known, the locations of possible bond sites along the path are known. For example, the areas occupied by the posts 12 and 14 in the x-y plane relative to the support structure 16 are known based on the specifications of the support structure and posts. Also, the locations of points along the perimeters of the posts 12 and 14 in the x-y plane are known. The points on the perimeters of the posts that define the straight-line portions 24 and 28 are known based on the particular partial winding of the wires 20 and 22 around the posts. Possible bond sites are points on the linear path occupied by the wiring portions 24 and 28 can be geometrically determined prior to wire bonding the die 18 to the wiring. The known locations of the paths of the wiring portions 24 and 28 simplify the wire bonding process by eliminating the need to search for the wiring, such as by way of image processing, in order to determine the location of bond sites.

The die 18 can be electrically coupled to other electronic devices by way of the wiring 20 and 22. The other devices can be attached to the support structure or separate from the support structure 16, such as off-structure device 32. The die 18 is wire bonded to both wires 20 and 22 in the exemplary circuit arrangement. Bond wire 34 connects contact pad 36 on the die 18 to bond site 38 on the wiring portion 24. Bond wire 40 connects contact pad 42 on the die 18 to bond site 44 on the wiring portion 28.

The following exemplary applications illustrate various alternative configurations of the guide posts, wiring, and electronic device(s).

Figure 2:
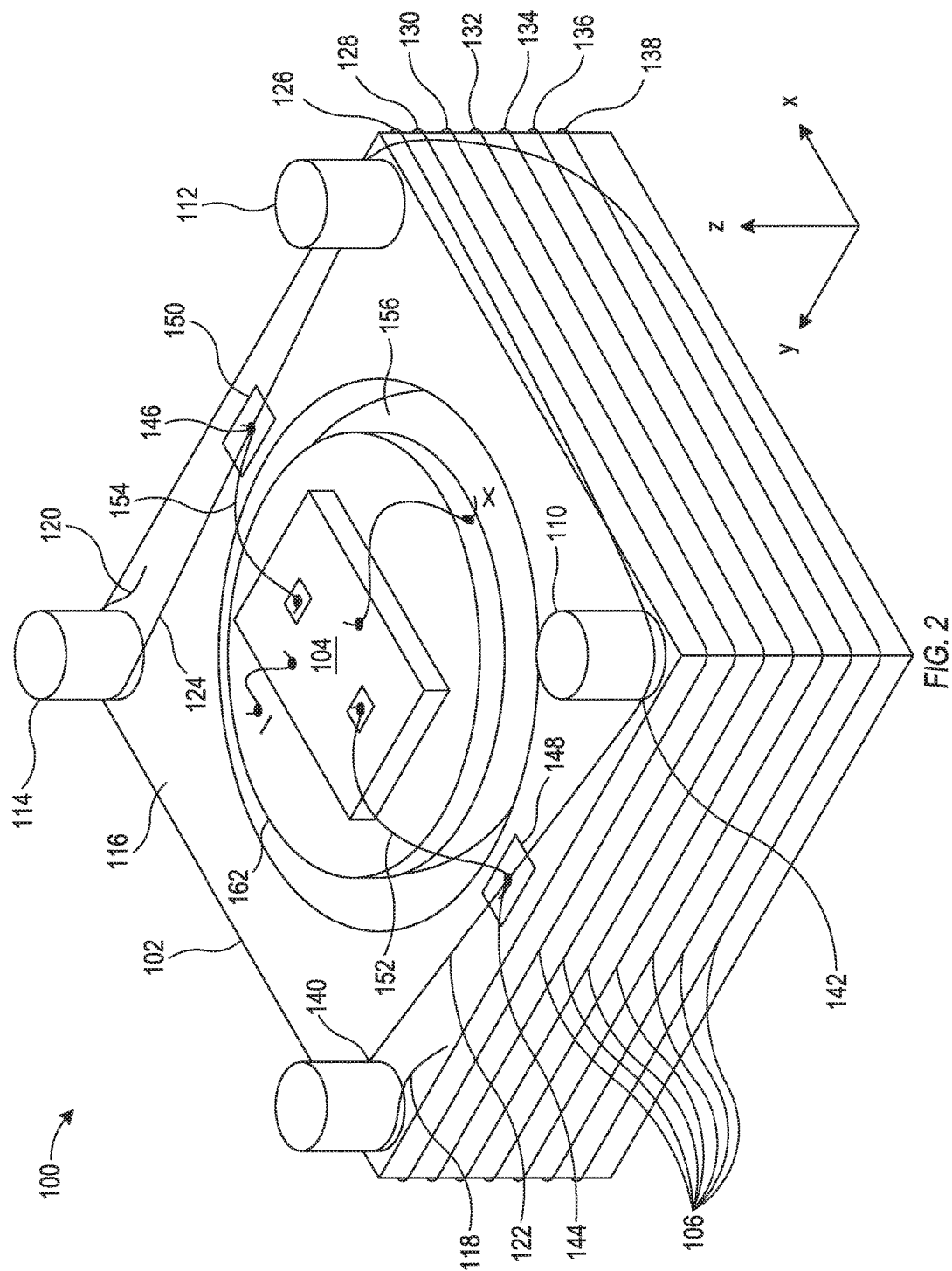
FIG. 2 shows an exemplary RF transponder arrangement in which the support structure has four posts for guiding and locating the antenna wire.

FIG. 2 shows an exemplary RF transponder arrangement 100 in which the support structure has four posts for guiding and locating the antenna wire. The RF transponder arrangement includes a support structure 102, an RF transponder 104, and an antenna 106 comprising round wire. The RF transponder may be packaged or unpackaged (a "bare die"), and active, semi-active, semi-passive, or passive according to application requirements.

Alternative implementations can include two or more posts for each location at which the antenna wire is to wire bonded to the RF transponder 104. The disclosed support structure includes four posts 108, 110, 112, and 114. The posts can have circular cross sections as shown. In alternative implementations, the posts can have any cross-sectional shape suitable for the application. For example, the cross sections can be polygonal, elliptical, or any irregular shape. The locations of the posts are dependent on desired bond sites. A bond site is the location at which the antenna wire or bond pad can be wire bonded to the RF transponder. In the exemplary antenna assembly, each of the posts extends from the surface 116 of the support structure 102. The locations of the posts is dependent on the locations at which the antenna wire is to be wire bonded to the RF transponder. The exemplary support structure includes four posts. In alternative implementations, the support structure can include more or fewer posts depending on the desired locations of the bond sites.

The antenna includes multiple sections (or "portions") of wire disposed at different locations on the support structure. In an exemplary implementation, the antenna wire is a continuous strand. The antenna wire includes end portions 118 and 120 wrapped at least partially around each of the posts 108 and 114, respectively. Middle portion 122 of the antenna wire extends from post 108 to post 110 and middle portion 124 extends from post 112 to post 114. End portions 118 and 120 can be attached to the support structure by a pressure-sensitive adhesive, a cut in the substrate, or other approach sufficient to hold the end portions in place as the wire is wrapped around the posts.

The antenna further includes another middle portion of wire that is disposed in multiple turns that circumscribe the z-axis of the support structure. Each adjacent turn occupies a different location on the z-axis. In the exemplary antenna, turns 126, 128, 130, 132, 134, 136, and 138 occupy different locations on the z-axis. The optimum spacing between and number of turns depends on application requirements and specification of the RF transponder. A pressure-sensitive adhesive could be used in some implementations to secure the turns to the support structure.

The positions of the posts and the portions of wire extending between the posts provides easy identification of bond sites when the antenna assembly is constructed. The locations and dimensions of the posts are fixed. Thus, the precise location of the path of the antenna wire between two posts can be determined based on the directions the portions of the antenna wire are wrapped at least partially around the posts. As the path of the antenna wire is known, the locations of possible bond sites along the path are known. For example, the areas occupied by the posts 108 and 110 in the x-y plane relative to the support structure 102 are known based on the specifications of the support structure and posts. Also, the locations 140 and 142 in the x-y plane are known based on the particular partial winding of end portion 118 around post 108 and particular partial winding around post 110. As locations 140 and 142 are known, the points on the linear path connecting locations 140 and 142 and occupied wire portion 122 can be geometrically determined prior to wire bonding the RF transponder to the antenna wire. The known location of the path of the wire portion 122 simplifies the wire bonding process by eliminating the need to search for the wire, such as by way of image processing, in order to determine the location of a bond site. The RF transponder arrangement 100 has exemplary bond sites 144 and 146.

Bond pads 148 and 150 can be optionally used to aid wire bonding the antenna wire to the RF transponder 104. The bond pads can be copper or aluminum metal foil and attached to the surface 116 of the support structure by a pressure-sensitive adhesive, for example. The RF transponder 104 can be connected to the antenna wire, either directly or indirectly, by bond wires 152 and 154. In a direct connection, one end of the bond wire is connected to the electronic device and the other end of the bond wire is connected to the portion of the wire that is connected to the metal foil pad. In an indirect connection, one end of the bond wire is connected to the electronic device, and the other end of the bond wire is connected to the metal foil pad. Each metal foil pad serves as a connection site between the round antenna wire and the RF transponder, providing a stable surface to which the round wire and bond wires can be connected. Prior approaches have used lead frames to connect electronic devices to conductors. However, the lead frames introduce additional bulk to the structure, which may be undesirable for some applications. The metal foil pads eliminate the need for lead frames, thereby reducing the profile of the structure.

The support structure 102 can be constructed from any material suitable for the intended application. The dimensions and shape of the support structure are also application dependent and can be a cuboid, open cylinder, torus or any irregular structure. The exemplary support structure has a void 156 between the one or more surfaces that circumscribe the support structure. The RF transponder 104 can be disposed in the void. The RF transponder has a first connection pad 158 coupled to the antenna wire at the bond site 144, and has a second connection pad 160 coupled to the antenna wire at bond site 146.

The RF transponder arrangement 100 can include an optional battery 162 disposed in void 156 in some implementations, and the RF transponder can be wire bonded to positive and negative terminals of the battery. The RF transponder arrangement 100 can further include one or more sensors (not shown), such as for sensing temperature or pH levels. The sensor(s) can be integrated with the RF transponder die or can be disposed on a separate IC die.

Figure 3:
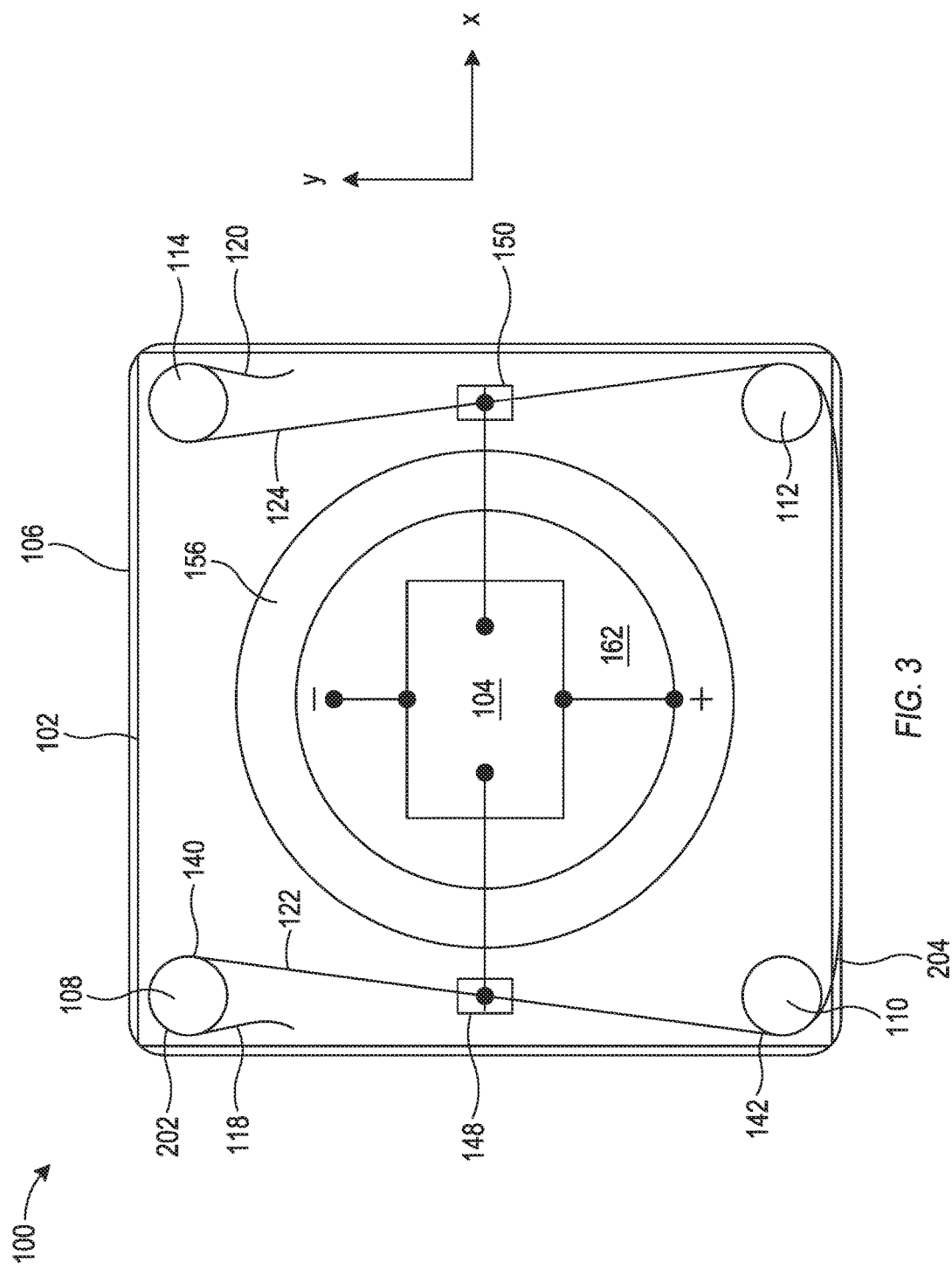
FIG. 3 shows a top view of the RF transponder arrangement.

FIG. 3 shows a top view of the RF transponder arrangement 100. The antenna includes end portions 118 and 120 at least partially wrapped around posts 108 and 114, respectively. End portion 118 is partially wrapped at least partially around post 108 in clockwise direction beginning at the outer portion 202 of post 108. The middle portion 122 extends from post 108 to post 110 and partially wraps around post 110. Another middle portion extends from post 110 and includes multiple turns, one of which is shown as turn 204. The last turn (not shown) of the multiple turns extends to middle portion 124, which partially wraps around post 112 and extends to end portion 120, which partially wraps around post 114. The end portions 118 and 120 can be optionally attached to the support structure 102 by a PSA, for example.

Figure 4:
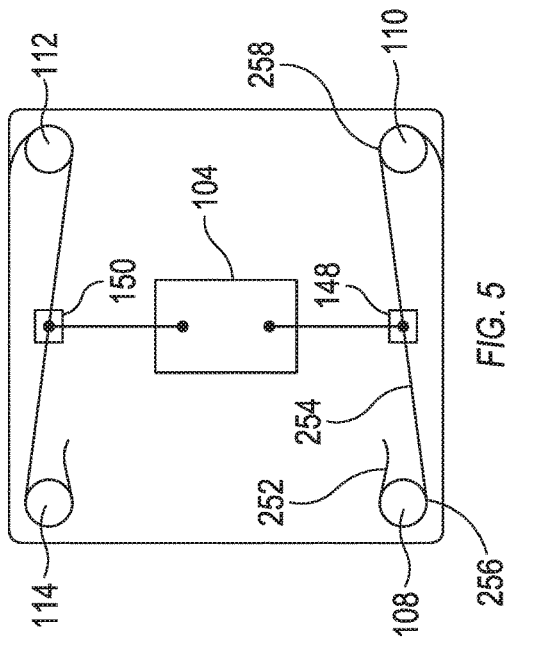
FIG. 4 shows a top view of an antenna assembly showing a path of antenna wire between inner portions of guide posts.
Figure 5:
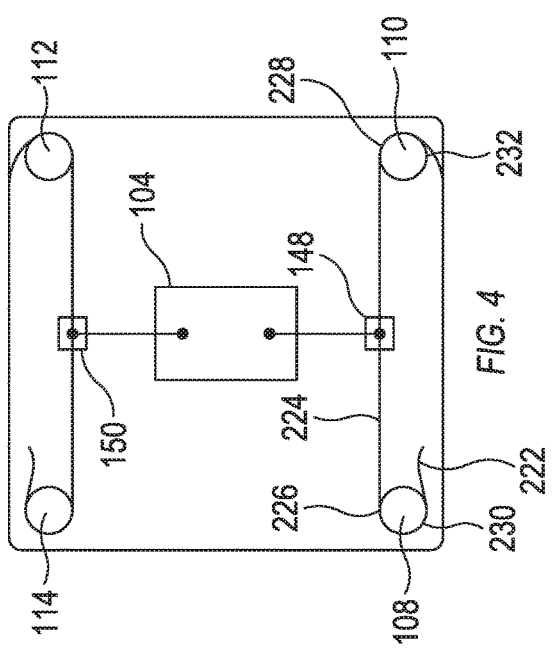
FIG. 5 shows a top view of an antenna assembly showing an alternative to the paths of antenna wire between guide posts as shown in FIG. 3.
Figure 6:
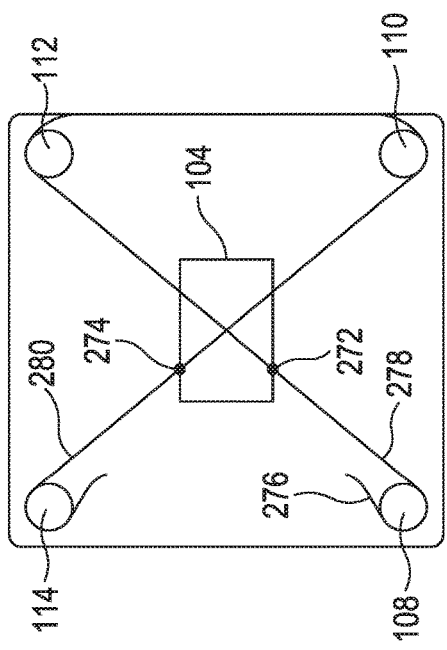
FIG. 6 shows a top view of an antenna assembly showing paths of antenna wire between diagonal guide posts.

FIGS. 4, 5, and 6 show alternative approaches to wrapping the antenna wire around the posts to provide known locations of bond sites. FIG. 4 shows a top view of an antenna assembly showing a path of antenna wire between inner portions of guide posts 108, 110, 112, and 114. End portion 222 of the antenna is at least partially wrapped partially around post 108. The path of the antenna wire from the end portion 222 around the post 108 leads to middle portion 224, which spans between the posts 108 and 110. The middle portion 224 contacts inner surfaces 226 and 228 of posts 108 and 110, respectively. The surfaces 226 and 228 are inner surfaces relative to outer surfaces 230 and 232 of posts 108 and 110 in that the inner surfaces are nearer the RF transponder 104. In contrast with FIG. 2, the middle portion 224 spans from the inner surfaces of both of posts 108 and 110. The middle portion 122 of the antenna wire in FIG. 3 spans from location 140 on the inner surface of post 108 to location 142 on the outer surface of the post 110.

FIG. 5 shows a top view of an antenna assembly showing an alternative to the paths of antenna wire between guide posts 108, 110, 112, and 114 of FIG. 3. End portion 252 of the antenna is wrapped at least partially around post 108. The path of the antenna wire from the end portion 252 around the post 108 leads to middle portion 254, which spans between the posts 108 and 110. The middle portion 254 contacts the outer surface 256 of post 108 and the inner surface 258 of post 110. The antenna assembly of FIG. 5 differs from the antenna assembly of FIG. 2 in that the middle portion 122 of the antenna wire in FIG. 3 spans from location 140 on the inner surface of post 108 to location 142 on the outer surface of the post 110.

FIG. 6 shows a top view of an antenna assembly showing paths of antenna wire between diagonal guide posts 108 and 114 and diagonal guide posts 110 and 114. The portions of the antenna wire between the diagonal posts can be used to make direct connections between the antenna wire and bond pads 272 and 274 on the RF transponder. The locations of the bond pads on the RF transponder and the placement of the RF transponder can be used to structure the locations and dimensions of the posts so that the bond wire passes directly over the bond pads. End portion 276 of the antenna is wrapped at least partially around post 108. The path of the antenna wire from the end portion 276 around the post 108 leads to middle portion 278, which spans between the posts 108 and 112. In an alternative arrangement, the middle portions 278 and 280 could be wire bonded to the RF transponder 104 as shown in FIGS. 2-5 instead of the illustrated direct connections.

Figure 7:
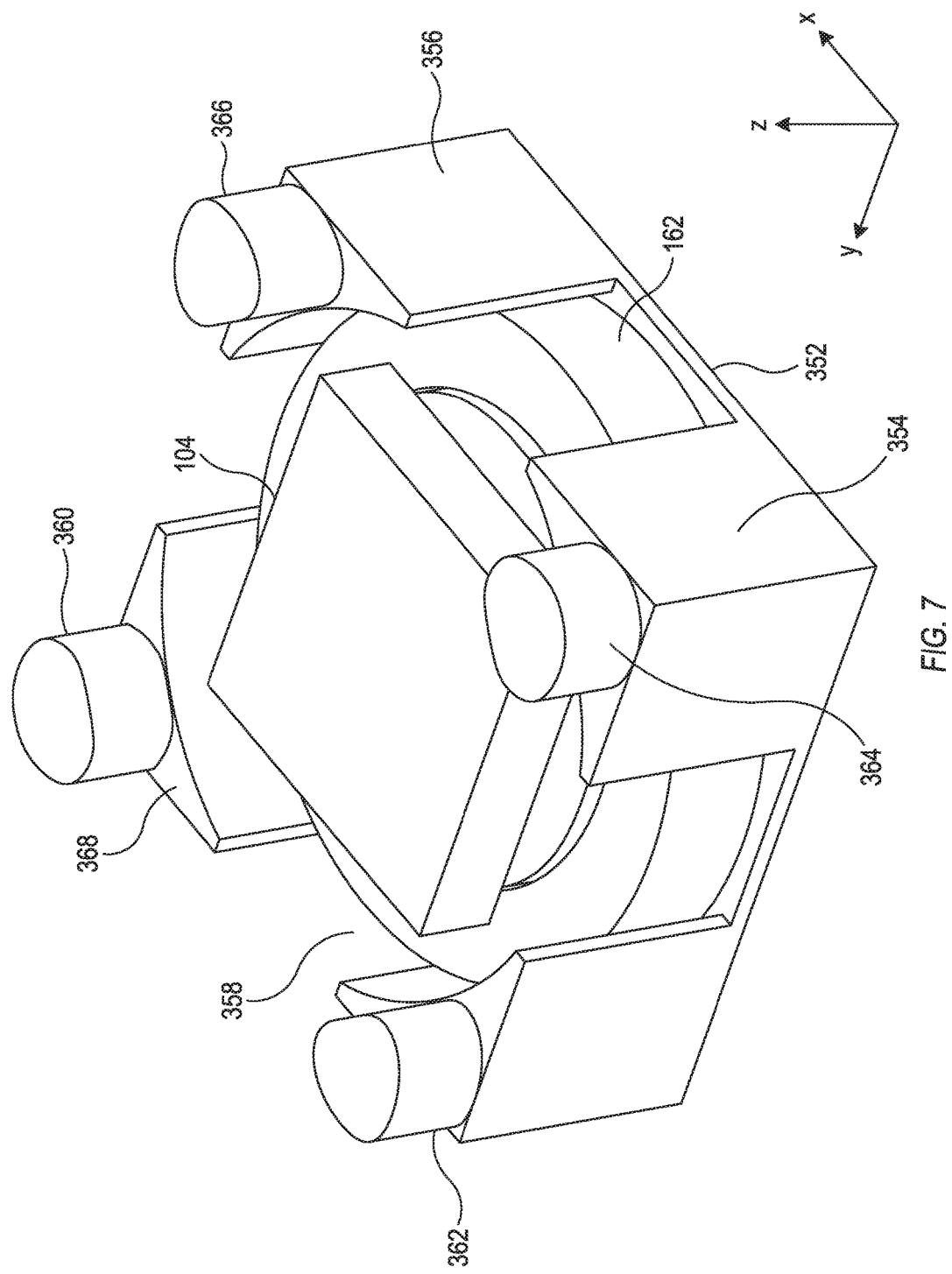
FIG. 7 shows an alternative shape for a support structure.

FIG. 7 shows an alternative shape for a support structure. Support structure 352 has open sides as compared to the support structure 102 of FIG. 1. There is no continuous surface that circumscribes the z-axis of the support structure 352. Support structure 352 has multiple surfaces that circumscribe the z-axis. Surfaces 354 and 356 are two examples of the multiple surfaces. The support structure has a void 358 for accommodating the RF transponder 104 and an optional battery 162. The support structure can be any desired shape depending on form-factor requirements. The support structure includes posts 360, 362, 364, and 366. Two or more of the posts can include at least one shoulder portion. For example, post 360 has a shoulder portion 368. The shoulder portion provides a stable bond site for wire bonding the antenna wire (not shown) to the RF transponder 104. Alternative configurations can have two posts as shown in FIG. 7 and/or different shapes that accommodate the antenna wire patterns shown in FIGS. 2, 4, 5, 6 and 7.

Figure 8:
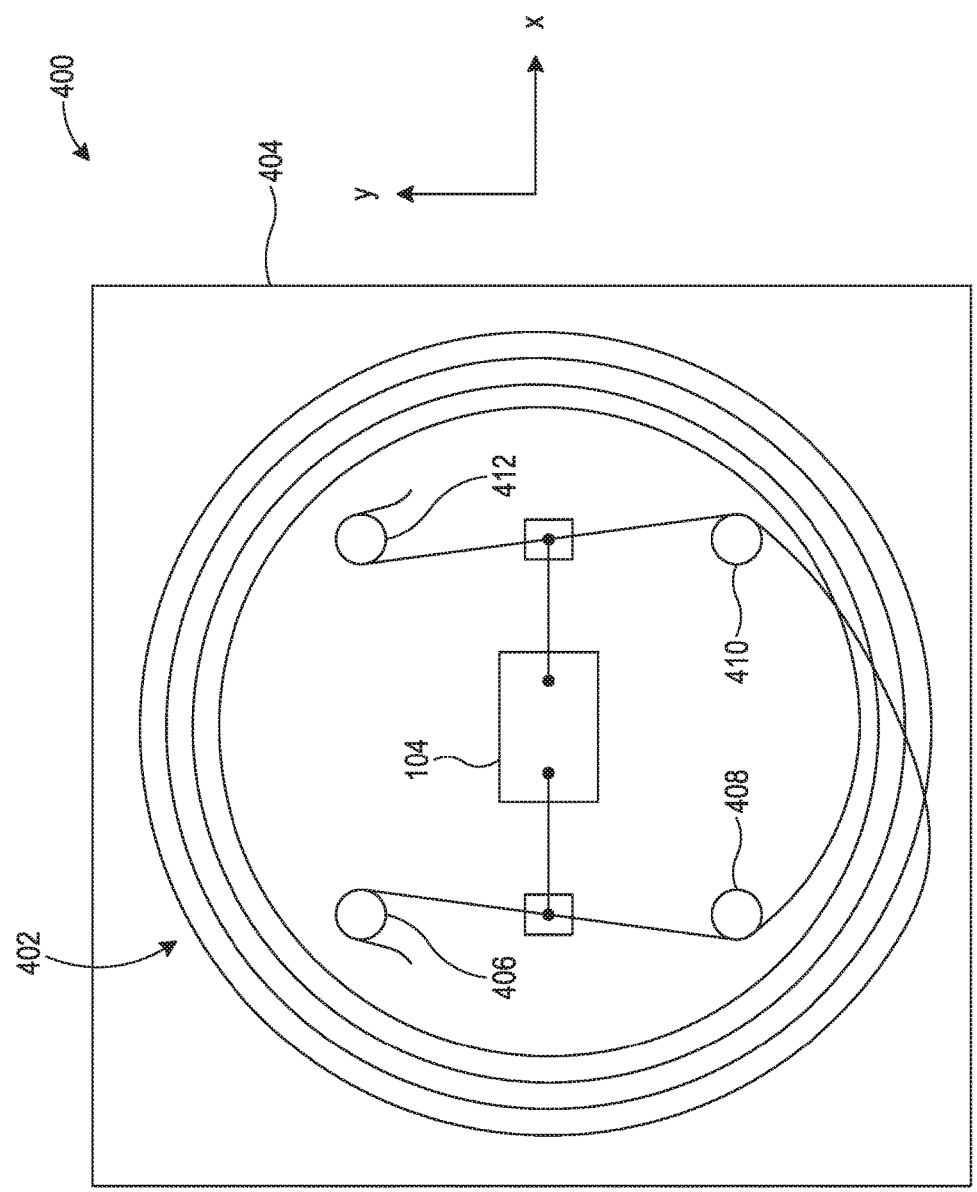
FIG. 8 shows a top view of an alternative RF transponder arrangement and antenna assembly.

FIG. 8 shows a top view of an alternative RF transponder arrangement 400 and antenna assembly. The transponder arrangement includes an RF transponder 104 and an antenna 402 disposed on a generally planar surface of a substrate 404. Whereas the antennas shown in FIGS. 2-7 have turns at different locations on the z-axis of the support structure, the antenna 402 has concentric turns on the z-axis. The substrate can be flexible or rigid.

The substrate can include guide posts 406, 408, 410, and 412. Alternative characteristics of the posts and patterns of antenna wire can be as described above for the arrangements in FIGS. 2-7.

The antenna wire can be round wire as described above, and the substrate 404 can have a void (not shown) in which the RF transponder 104 and an optional battery (not shown) can be disposed. The antenna wire, RF transponder, and optional battery can be attached to the substrate by a layer of PSA, for example.

Figure 9:
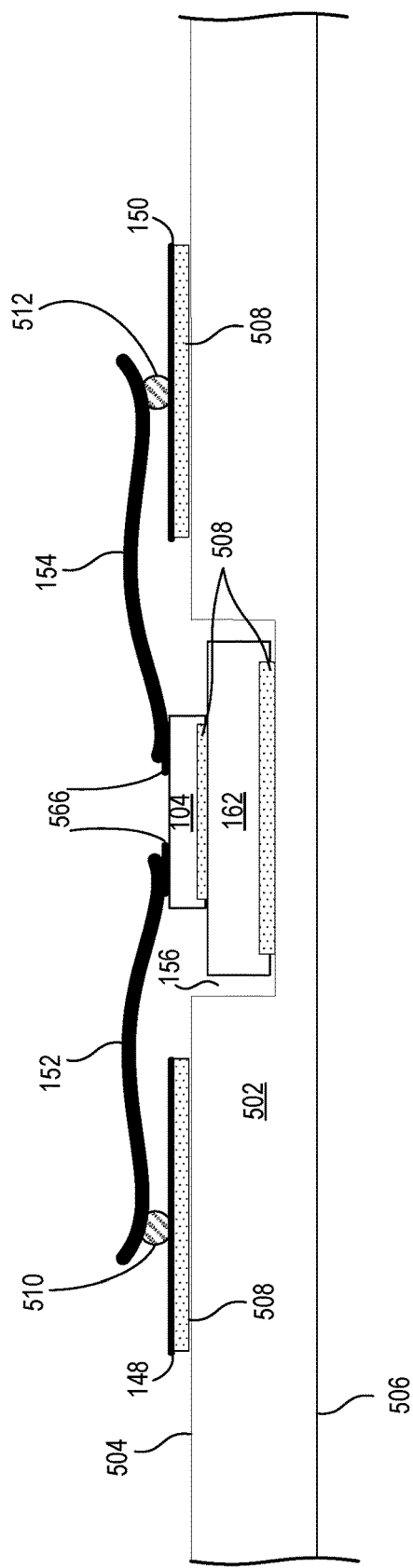
FIG. 9 shows a cross-sectional view of a portion of an RF transponder arrangement including the wire bond from the RF transponder to the round antenna wire.

FIG. 9 shows a cross-sectional view of a portion of an RF transponder arrangement including the wire bond from the RF transponder to the round antenna wire. The support structure 502 has a first major surface 504 and a second major surface 506 opposite the first major surface. The support structure can include a void 156. A PSA 508 can be used to adhere the metal foil bond pads 148 and 150 to surface 504, and the RF transponder, and optional battery 162 to a surface of the support structure 502 that defines the void 156.

The portions 510 and 512 of the wire can be connected to the metal foil pads 148 and 150, respectively, with weld joints. The weld joints may be formed by friction or ultrasonic welding, for example.

The RF transponder 104 is electrically connected to the portions 510 and 512 of the wire by bond wires 152 and 154, respectively. In the structure of FIG. 9, the bond wires 152 and 154 are directly connected to the wire portions 510 and 512. Bond wire 152 connects one of contact pads 566 to the wire portion 510 on bond pad 148, and bond wire 154 connects the other one of the contact pads 566 to the wire portion 512 on bond pad 150. Wedge bonding or ball bonding may be used to connect the bond wires, depending on application requirements and restrictions.

The metal foil pads 148 and 150 provide stable and visible structures that are dedicated to connecting the bond wires 152 and 154 to the wire portions 510 and 512.

A polymer conformal coating (not shown), which is sometimes referred to as a "glob-top," can cover the RF transponder 104, bond wires 152 and 154, metal foil pads 148 and 150, and wire portions 510 and 512. The polymer conformal coating may be an epoxy, acrylic, polyurethane, or silicone, depending on application requirements.

Figure 10:
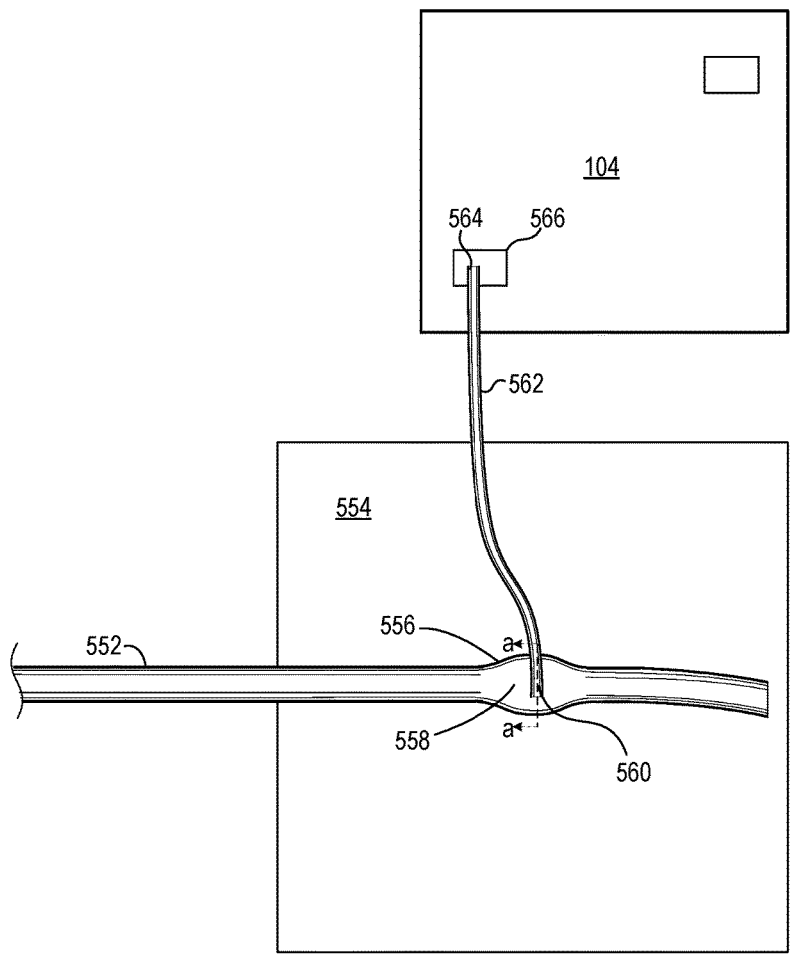
FIG. 10 shows a plan view of an RF transponder wire bonded to a portion of round antenna wire that is connected to a metal foil pad.

FIG. 10 shows a plan view of RF transponder 104 wire bonded to a portion of round wire 552 that is connected to a metal foil pad 554. The wire 552 and metal foil pad 554 are representative of the antenna wire 122 and 124 and bond pads 148 and 150 of FIG. 2, for example.

A portion 556 of the wire 552 that is disposed on the metal foil pad 554 is compressed, forming a flat contact area 558 that is amenable to wire bonding. In addition to forming a contact area for wire bonding, compression of the intersection mechanically interlocks a portion of the wire 552 with the metal foil pad 554, thereby providing a stable target for welding the wire at the flat contact area 558 to the metal foil pad.

Once the wire 552 has been welded to the metal foil pad 554 at the flat contact area 558, the RF transponder can be wire bonded to the flat contact area 558. One end 560 of the bond wire 562 is bonded to flat contact area 558, and the other end 564 of the bond wire is bonded to the contact pad 566 on the RF transponder 104. The bond wire may be wedge bonded to provide a low profile. In other applications, the bond wires may be ball bonded. The weld joint of the flat contact area 558 to the metal foil pad 554 and the wire bond 562 to the flat contact area 558 may be replicated for other portions of the wire 552 or for other portions of other wire segments.

Figure 11:
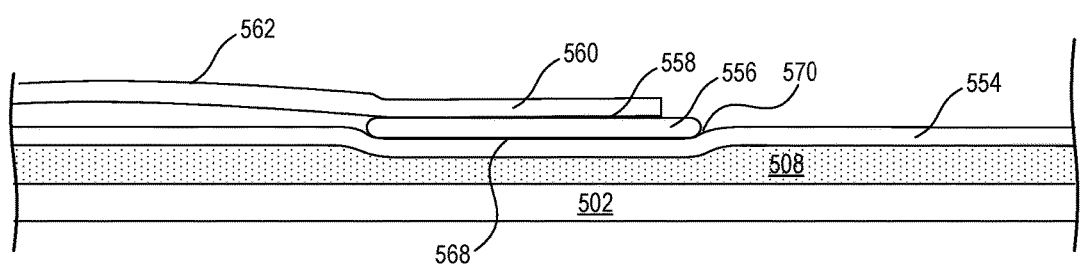

FIG. 11 shows a cross section of a portion of the structure of FIG. 10 taken in direction a. The compressed portion 556 of the wire 552 does not have a round cross section as do other portions of the wire. Rather, the compressed portion has a first flat contact area 558 wire bonded to bond wire 562, and a second flat contact area 568 that is welded to the metal foil pad 554. Compression of wire portion 556 creates a recessed portion 570 in the metal foil pad 554. The compressed portion 556 within the recessed portion 570 provides a stable target for welding the wire to the metal foil pad, which might otherwise be problematic.

FIG. 12 shows an alternative wire bond connection between the RF transponder 104 and antenna wire using bond pads. The bond 152 and 154 wires are directly connected to the metal foil pads 148 and 150 rather than to the round wire. Portions 510 and 512 of round wire are welded to metal foil pads 148 and 150, respectively. Bond wires 152 and 154 are wire bonded directly to the metal foil pads 148 and 150, respectively. Each metal foil pad is directly electrically connected to only a wire portion and to the bond wire. The indirect attachment of the bond wires to the wire portions 510 and 512 may be used in place of the direct attachment approaches shown in FIG. 9.

FIG. 13 shows a partial cross-sectional view of an alternative implementation in which the portions of antenna wire are disposed in channels in the support structure. The support structure 502 has channels 602 and 604 formed in the surface 504, and the antenna wire portions 510 and 512 are disposed in the channels. The bond wires 152 and 154 are connected to the contact pads 566 and can be directly connected to the wire portions 510 and 512 by the wedge bonding or ball bonding. The channels aid in stabilizing the wire portions during the bonding process.

The present invention is thought to be applicable to a variety of applications. Other aspects and embodiments will be apparent to those skilled in the art from consideration of the specification and practice of the circuits and methods disclosed herein. It is intended that the specification and illustrated embodiments be considered as examples only, with a true scope of the invention being indicated by the following claims.

What is claimed is:

1. A circuit arrangement, comprising:
   a support structure that includes a first post and a second post;

electrically conductive round wire, the wire having a round cross-section, a first portion wrapped at least partially around the first post, a second portion extending in a straight line from a point on a perimeter of the first post to a point on a perimeter of the second post, and a third portion wrapped at least partially around the second post, wherein the second portion of the round wire defines one or more bond sites; and an electronic device electrically connected to the round wire at one of the one or more bond sites.

2. The circuit arrangement of claim 1, wherein the one of the one or more bond sites is on a surface of the support structure and further comprising a bond wire connected to the electronic device and to the round wire at the one of the one or more bond sites.

3. The circuit arrangement of claim 1, wherein the one of the one or more bond sites is on a surface of the electronic device, and the electronic device is directly connected to the round wire at the one of the one or more bond sites by a respective weld joint or a respective solder joint.

4. The circuit arrangement of claim 1, further comprising a metal foil pad attached to a surface of the support structure at the one of the one or more bond sites, wherein the round wire is directly connected to the metal foil pad.

5. The circuit arrangement of claim 1, further comprising a channel disposed on a surface of the support structure between the first post and the second post, wherein the second portion of the round wire is disposed in the channel.

6. The circuit arrangement of claim 1, wherein the support structure has a void, and the electronic device is disposed in the void.

7. The circuit arrangement of claim 1, wherein the support structure is one of a cuboid, open cylinder, or torus.

8. The circuit arrangement of claim 1, wherein:

the support structure further includes a third post and a fourth post;

the round wire further includes a fourth portion wrapped at least partially around the third post, a fifth portion extending in a straight line from a point on the perimeter of the third post to a point on the perimeter of the fourth post, and a sixth portion wrapped at least partially around the fourth post, wherein the fifth portion of the round wire defines one or more bond sites on the surface of the support structure; and the electronic device is electrically connected to the round wire at one of the one or more bond sites defined by the fifth portion.

9. The circuit arrangement of claim 8, wherein the electronic device is a radio frequency transponder, and the round wire defines an antenna.

10. The circuit arrangement of claim 9, wherein the round wire includes a seventh portion that connects the third portion to the fourth portion, and the seventh portion includes a plurality of turns that circumscribe the support structure.

11. The circuit arrangement of claim 10, wherein adjacent turns of the plurality of turns are disposed on different locations along a z-axis of the support structure.

12. The circuit arrangement of claim 10, wherein adjacent turns of the plurality of turns are disposed on same locations along a z-axis of the support structure.

13. The circuit arrangement of claim 10, wherein at least portions of the plurality of turns are attached to the support structure by a pressure-sensitive adhesive.

* * * * *